US012648277B2

(12) United States Patent
Zhu et al.

(10) Patent No.: US 12,648,277 B2
(45) Date of Patent: Jun. 2, 2026

(54) DISPLAY PANEL, METHOD FOR FABRICATING DISPLAY PANEL AND DISPLAYING DEVICE

(71) Applicant: BOE Technology Group Co., Ltd., Beijing (CN)

(72) Inventors: Xiaoyan Zhu, Beijing (CN); Jin Yang, Beijing (CN); Guangcai Yuan, Beijing (CN); Xinhong Lu, Beijing (CN); Ling Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 907 days.

(21) Appl. No.: 17/775,980

(22) PCT Filed: Jun. 22, 2021

(86) PCT No.: PCT/CN2021/101664
§ 371 (c)(1),
(2) Date: May 11, 2022

(87) PCT Pub. No.: WO2022/266865
PCT Pub. Date: Dec. 29, 2022

(65) Prior Publication Data
US 2024/0154074 A1 May 9, 2024

(51) Int. Cl.
*H10H 20/85* (2025.01)
*H10H 20/853* (2025.01)
(Continued)

(52) U.S. Cl.
CPC ........ *H10H 20/853* (2025.01); *H10H 20/857* (2025.01); *H10W 90/00* (2026.01); *H10H 20/0362* (2025.01); *H10H 20/0364* (2025.01)

(58) Field of Classification Search
CPC .... B32B 2457/202; H05K 2201/10136; G09G 2380/02; G09G 2300/0426;
(Continued)

(56) References Cited

U.S. PATENT DOCUMENTS

2016/0077370 A1* 3/2016 Her .................. G02F 1/133308
349/122
2017/0192291 A1* 7/2017 Shi ................... G02F 1/133308
(Continued)

FOREIGN PATENT DOCUMENTS

CN 110503898 A 11/2019
CN 110600494 A 12/2019
(Continued)

OTHER PUBLICATIONS

Office Action dated Feb. 10, 2026, issued in counterpart CN Application No. 202180001575.3, with English translation. (18 pages).

*Primary Examiner* — Moin M Rahman
(74) *Attorney, Agent, or Firm* — WHDA, LLP

(57) ABSTRACT

The present application provides a display panel, a method for fabricating a display panel and a displaying device. The display panel particularly includes at least two neighboring displaying base plates; each of the them includes a flexible substrate and a transparent cover plate that are provided in stack; the flexible substrate is delimited into a displaying region, a bending region and a bonding region, the displaying region and the bonding region are connected by the bending region, the displaying region and the bonding region are parallel, and the bonding region is located on one side of the displaying region that is away from the transparent cover plate; the transparent cover plate is provided with a light shielding layer on one side that is closer to the flexible substrate, and an orthographic projection of the
(Continued)

bending region on the transparent cover plate is within an area of the light shielding layer.

16 Claims, 6 Drawing Sheets

(51) Int. Cl.
H10H 20/857 (2025.01)
H10W 90/00 (2026.01)
H10H 20/01 (2025.01)

(58) Field of Classification Search
CPC ...... H10K 77/10–111; H10K 2102/311; H10K 50/844; H10K 59/131; H10K 50/805; H10K 50/852; H10K 50/856; H10K 59/12; H10K 50/8445; H10K 50/85; H10K 59/10; H10K 59/129; H10K 2101/00; H10K 2102/361; H10K 71/00; H10K 59/35; H10K 50/11; H10K 50/156; H10K 85/615; H10K 85/624; H10K 85/626; H10K 85/631; H10K 85/633; H10K 85/636; H10K 85/6572; H10K 2101/30; H10K 2101/40; H10K 50/155; H10K 50/115; H10K 50/13; H10K 50/80; H10K 85/6574; H10K 59/873; H10K 77/111; H10K 50/15; H10K 50/16; H10K 50/171; H10K 2102/351; G02F 1/133305; G02F 1/133388; G02F 1/13452; G02F 1/136254; G02F 2201/50; G02F 2202/28; H01L 2224/73204; Y02E 10/549; B60K 37/02; B60K 2370/1523; B60K 2370/331; B60K 2370/52; B60R 1/00
See application file for complete search history.

(56) References Cited

U.S. PATENT DOCUMENTS

| | | | |
|---|---|---|---|
| 2020/0058624 A1 | 2/2020 | Su et al. | |
| 2020/0251457 A1 | 8/2020 | Huang et al. | |
| 2022/0293016 A1* | 9/2022 | Yang | H10K 77/111 |
| 2023/0329070 A1* | 10/2023 | Long | H10K 59/121 |
| | | | 257/40 |

FOREIGN PATENT DOCUMENTS

| | | |
|---|---|---|
| CN | 111508935 A | 8/2020 |
| CN | 111584475 A | 8/2020 |
| CN | 112382212 A | 2/2021 |
| CN | 112526780 A | 3/2021 |

* cited by examiner

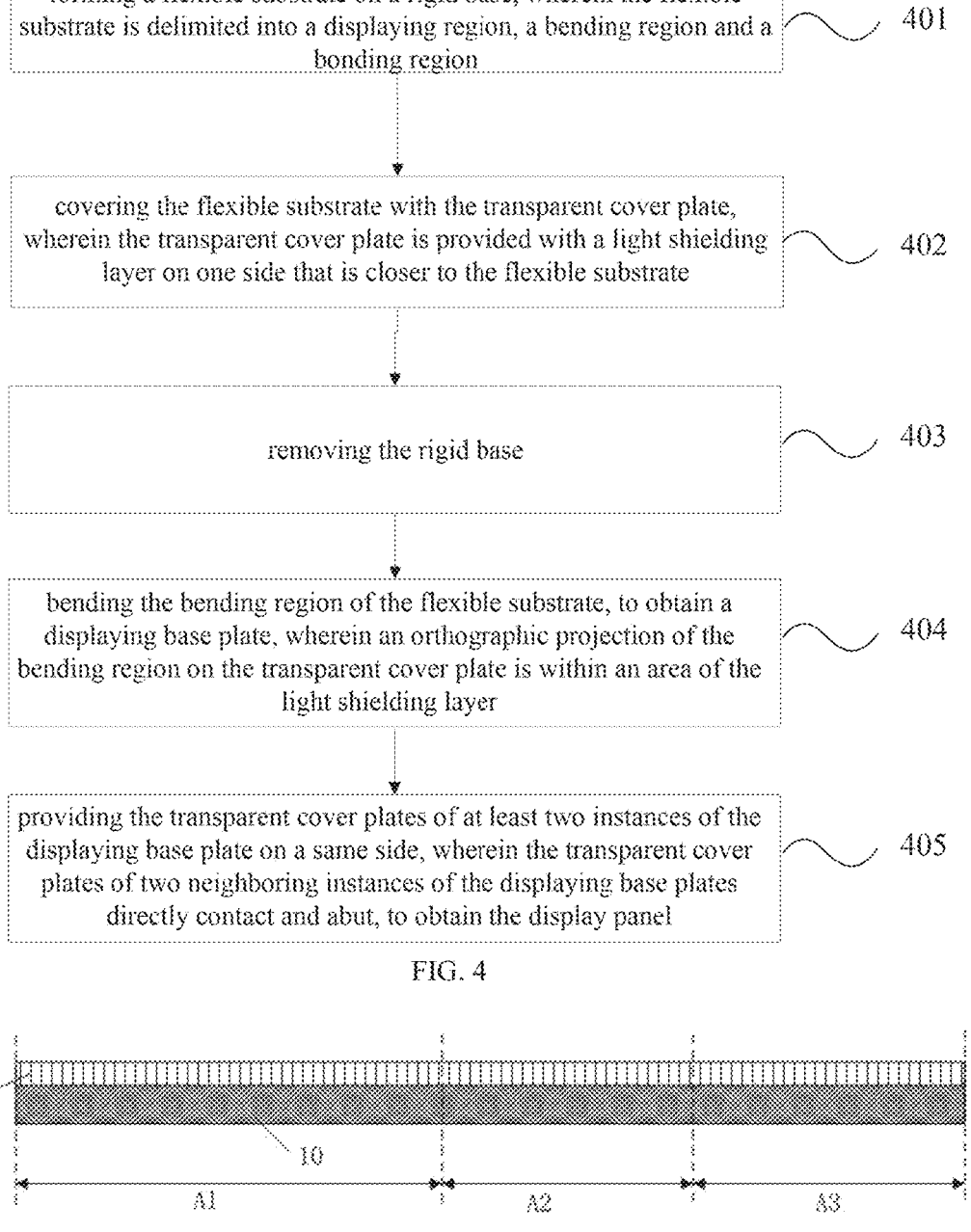

forming a flexible substrate on a rigid base, wherein the flexible substrate is delimited into a displaying region, a bending region and a bonding region    401 covering the flexible substrate with the transparent cover plate, wherein the transparent cover plate is provided with a light shielding layer on one side that is closer to the flexible substrate    402 removing the rigid base    403 bending the bending region of the flexible substrate, to obtain a displaying base plate, wherein an orthographic projection of the bending region on the transparent cover plate is within an area of the light shielding layer    404 providing the transparent cover plates of at least two instances of the displaying base plate on a same side, wherein the transparent cover plates of two neighboring instances of the displaying base plates directly contact and abut, to obtain the display panel    405

DISPLAY PANEL, METHOD FOR FABRICATING DISPLAY PANEL AND DISPLAYING DEVICE

TECHNICAL FIELD

The present application relates to the technical field of displaying, and particularly relates to a display panel, a method for fabricating a display panel and a displaying device.

BACKGROUND

With the development of the displaying technique, the Light Emitting Diode (LED) displaying technique, as a novel displaying technique, has gradually become one of the research hotspots. Wherein, the Micro Light Emitting Diodes (Micro-LED) with a lower size are especially extensively applied to high-resolution products, such as a smart-phone or a virtual display screen of the resolution of 4K or even 8K. In particular applications, in order to realize the displaying of an ultra-large panel, it is usually required to splice minisized displaying base plates of a certain quantity.

In the related art, the supporting of the displaying base plates is realized usually by providing a rigid base at the bottom. Particularly, the displaying base plate may comprise a displaying region, a bending region and a bonding region that are sequentially provided. In order to realize the bending of the bending region, it is usually required to cut part of the rigid base at the bottom of the bending region, which very easily results in wire-breakage imperfect caused by direct abutting between the flexible substrate of the bending region and the corner of the rigid base. Furthermore, because the packaging layer at the top of the displaying base plate easily warps after solidification, it very easily affects the effect of splicing of the displaying base plates. Moreover, because the bending region cannot be blackened, after the neighboring displaying base plates have been spliced, the chromatic aberration at the gap between the butting bending regions is obvious, which very easily deteriorates the effect of display-ing of the display panel.

SUMMARY

In order to solve the problem in the prior art that both of the effect of splicing and the effect of displaying of conven-tional displaying base plates are poor, the embodiments of the present application provide a display panel, a method for fabricating a display panel and a displaying device.

In the first aspect, an embodiment of the present appli-cation provides a display panel, wherein the display panel comprises at least two neighboring displaying base plates;

each of the displaying base plates comprises a flexible substrate and a transparent cover plate that are provided in stack;

the flexible substrate is delimited into a displaying region, a bending region and a bonding region, the displaying region and the bonding region are connected by the bending region, the displaying region and the bonding region are parallel, and the bonding region is located on one side of the displaying region that is away from the transparent cover plate;

the transparent cover plate is provided with a light shield-ing layer on one side that is closer to the flexible substrate, and an orthographic projection of the bend-ing region on the transparent cover plate is within an area of the light shielding layer; and the transparent cover plates of the two neighboring dis-playing base plates at least partially directly contact and abut.

Optionally, a buffer layer, a trace layer, a first planariza-tion layer, a passivation layer and a second planarization layer are provided in stack on the flexible substrate; and each of the displaying region and the bonding region of the flexible substrate further comprises an electrode layer, and the electrode layer is located between the first planarization layer and the second planarization layer.

Optionally, the displaying base plate further comprises a light emitting device and a circuit board;

the light emitting device is electrically connected to the electrode layer located at the displaying region, and the light emitting device is located on the one side of the transparent cover plate that is closer to the flexible substrate; and the circuit board is electrically connected to the electrode layer located at the bonding region.

Optionally, the display panel further comprises a first adhesive layer provided on one side of the light emitting device that faces the transparent cover plate, and, a second adhesive layer provided between the neighboring light emit-ting devices.

Optionally, an orthographic projection of the second adhesive layer on the transparent cover plate at least par-tially overlaps with the light shielding layer.

Optionally, a color of the light shielding layer and a color of the second adhesive layer are the same.

Optionally, a material of the light shielding layer is a black printing ink, a luminosity of the black printing ink is less than 20, and both of a red-green value and a yellow-blue value of the black printing ink are less than 0.05.

Optionally, a material of the transparent cover plate comprises at least one of a glass and a transparent plastic.

In the second aspect, an embodiment of the present application further discloses a method for fabricating a display panel, wherein the method comprises:

forming a flexible substrate on a rigid base, wherein the flexible substrate is delimited into a displaying region, a bending region and a bonding region;

covering the flexible substrate with the transparent cover plate, wherein the transparent cover plate is provided with a light shielding layer on one side that is closer to the flexible substrate;

removing the rigid base;

bending the bending region of the flexible substrate, to obtain a displaying base plate, wherein an orthographic projection of the bending region on the transparent cover plate is within an area of the light shielding layer; and providing the transparent cover plates of at least two instances of the displaying base plate on a same side, wherein the transparent cover plates of two neighboring instances of the displaying base plates directly contact and abut, to obtain the display panel.

Optionally, before the step of covering the flexible sub-strate with the transparent cover plate, the method further comprises:

forming a buffer layer, a trace layer, a first planarization layer, an electrode layer, a passivation layer and a second planarization layer on the flexible substrate, wherein the electrode layer is located at the displaying region and the bonding region.

Optionally, before the step of bending the bending region of the flexible substrate, the method further comprises:

electrically connecting the light emitting device to the electrode layer located at the displaying region, and electrically connecting the circuit board to the electrode layer located at the bonding region; and forming a first adhesive layer on one side of the light emitting device that faces the transparent cover plate, and forming a second adhesive layer between neighboring light emitting devices.

Optionally, the step of removing the rigid base comprises: removing the rigid base by laser lift-off.

In the third aspect, an embodiment of the present application further discloses a displaying device, wherein the displaying device comprises the display panel according to any one of the above items.

In the embodiments of the present application, the transparent cover plate can support the displaying base plate from the top of the displaying base plate, which omits the operation of providing a rigid base in the displaying base plate, so as to prevent wire-breakage imperfect caused by direct abutting between the rigid base and the bending region of the flexible substrate, to improve the yield of the displaying base plate. Furthermore, in the display panel, the transparent cover plates of the two neighboring displaying base plates at least partially contact or abut, which, because the flatness of the transparent cover plates are high, can facilitate the splicing between the neighboring displaying base plates. Moreover, because the orthographic projection of the bending region on the transparent cover plate is within the area of the light shielding layer, the light shielding layer can block the gap between the two neighboring displaying base plates, to prevent chromatic aberration at the gap, which can improve the effect of displaying of the display panel.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art can obtain other figures according to these figures without paying creative work.

FIG. 4 schematically shows a flow chart of the steps of the method for fabricating a display panel according to an embodiment of the present application;

FIG. 5 schematically shows a schematic structural diagram of the formation of the flexible substrate;

DESCRIPTION OF THE REFERENCE NUMBERS

Figures 1, 2:
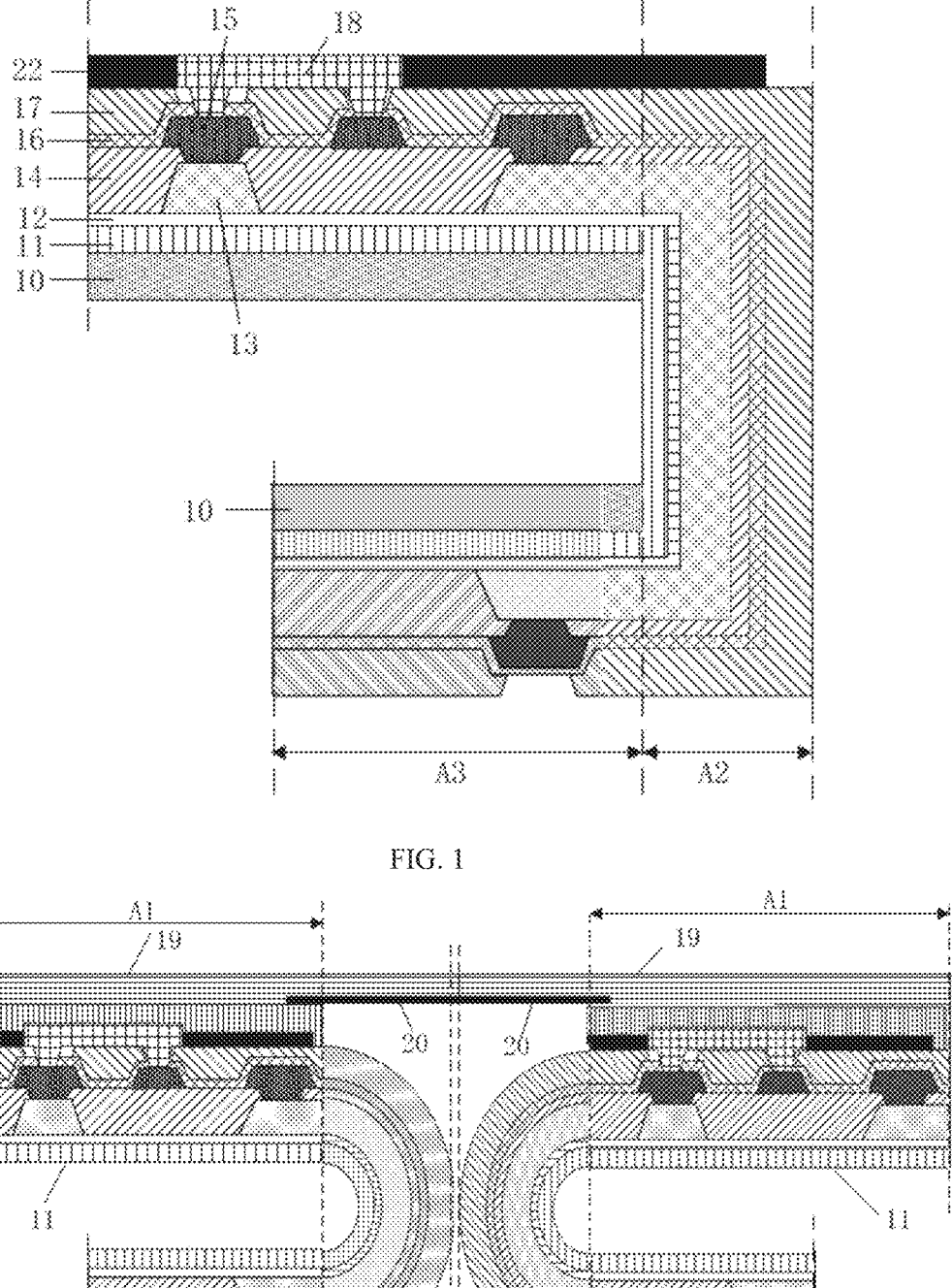
FIG. 1 schematically shows a schematic structural diagram of a displaying base plate in the related art.
FIG. 2 schematically shows a schematic structural diagram of the display panel according to an embodiment of the present application.

10—rigid base, 11—flexible substrate, 12—buffer layer, 13—trace layer, 14—first planarization layer, 15—electrode layer, 16—passivation layer, 17—second planarization player, 18—light emitting device, 19—transparent cover plate, 20—light shielding layer, 21—first adhesive layer, 22—second adhesive layer, 23—circuit board, A1—displaying region, A2—bending region, A3—bonding region, N1—first via hole, N2—second via hole, N3—third via hole, N4—first opening, and N5—second opening.

DETAILED DESCRIPTION

In order to make the objects, the technical solutions and the advantages of the embodiments of the present application clearer, the technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

The features defined by the terms "first" and "second" in the description and the claims of the present application may explicitly or implicitly comprise one or more of the features. In the description of the present application, unless stated otherwise, the meaning of "plurality of" is "two or more". Furthermore, the "and/or" in the description and the claims indicates at least one of the linked objects, and the character "/" generally indicates that the linked objects are of the relation of "or".

In the description of the present application, it should be understood that the terms that indicate orientation or position relations, such as "central", "longitudinal", "transverse", "length", "width", "thickness", "upper", "lower", "front", "rear", "left", "right", "vertical", "horizontal", "top", "bottom", "inner", "outer", "clockwise", "anticlockwise", "axial", "radial" and "circumferential", are based on the orientation or position relations shown in the drawings, and are merely for conveniently describing the present application and simplifying the description, rather than indicating or implying that the device or element must have the specific orientation and be constructed and operated according to the specific orientation. Therefore, they should not be construed as a limitation on the present application.

In the description of the present application, it should be noted that, unless explicitly defined or limited otherwise, the terms "mount", "connect" and "link" should be interpreted broadly. For example, it may be fixed connection, detachable connection, or integral connection; it may be mechanical connection or electrical connection; and it may be direct connection or indirect connection by an intermediate medium, and may be the internal communication between two elements. For a person skilled in the art, the particular meanings of the above terms in the present application may be comprehended according to particular situations.

Referring to FIG. 1, a schematic structural diagram of a displaying base plate in the related art is shown. As shown in FIG. 1, the displaying base plate may comprise a displaying region A1, a bending region A2 and a bonding region A3, the displaying region A1 and the bonding region A3 are connected by the bending region A2, and the displaying region A1 and the bonding region A3 are parallel. The displaying base plate may comprise a rigid base 10, a flexible substrate 11, a buffer layer 12, a trace layer 13, a first planarization layer 14, an electrode layer 15, a passivation layer 16 and a second planarization layer 17 that are provided sequentially in stack. The light emitting device 18 may be electrically connected to the electrode layer 15 located at the displaying region A1. The light emitting device 18 is further provided with a black-adhesive layer at the side wall. The black-adhesive layer may be used to block the internal structure of the displaying base plate. Furthermore, the black-adhesive layer can prevent cross-color between the light rays emitted by the light emitting devices 18.

As shown in FIG. 1, in order to realize the bending of the bending region, it is required to remove the rigid base 10 at the bottom of the bending region A2, which very easily results in wire-breakage imperfect caused by direct abutting between the flexible substrate 11 of the bending region A2 and the corner of the rigid base 10. Furthermore, because the second adhesive layer 22 at the top of the displaying base plate easily warps after solidification, after a plurality of displaying base plates have been spliced, it very easily affects the effect of splicing of the displaying base plates. Moreover, because the bending region cannot be blackened, after the neighboring displaying base plates have been spliced, the chromatic aberration at the gap between the butting bending regions is obvious, which very easily deteriorates the effect of displaying of the display panel.

Therefore, in the embodiments of the present application, by providing a transparent cover plate at the top of the displaying base plate, the transparent cover plate can support the displaying base plate from the top of the displaying base plate, which omits the operation of providing a rigid base in the displaying base plate, so as to prevent wire-breakage imperfect caused by direct abutting between the rigid base and the bending region of the flexible substrate. Furthermore, in the display panel, the transparent cover plates of the two neighboring displaying base plates at least partially contact or abut, which, because the flatness of the transparent cover plates are high, it can facilitate the splicing between the neighboring displaying base plates. Moreover, because the orthographic projection of the bending region on the transparent cover plate is within the area of the light shielding layer, the light shielding layer can block the gap between the two neighboring displaying base plates, to prevent chromatic aberration at the gap, which can improve the effect of displaying of the display panel.

Referring to FIG. 2, a schematic structural diagram of the display panel according to an embodiment of the present application is shown. As shown in FIG. 2, the display panel may comprise at least two neighboring displaying base plates.

Figure 3:
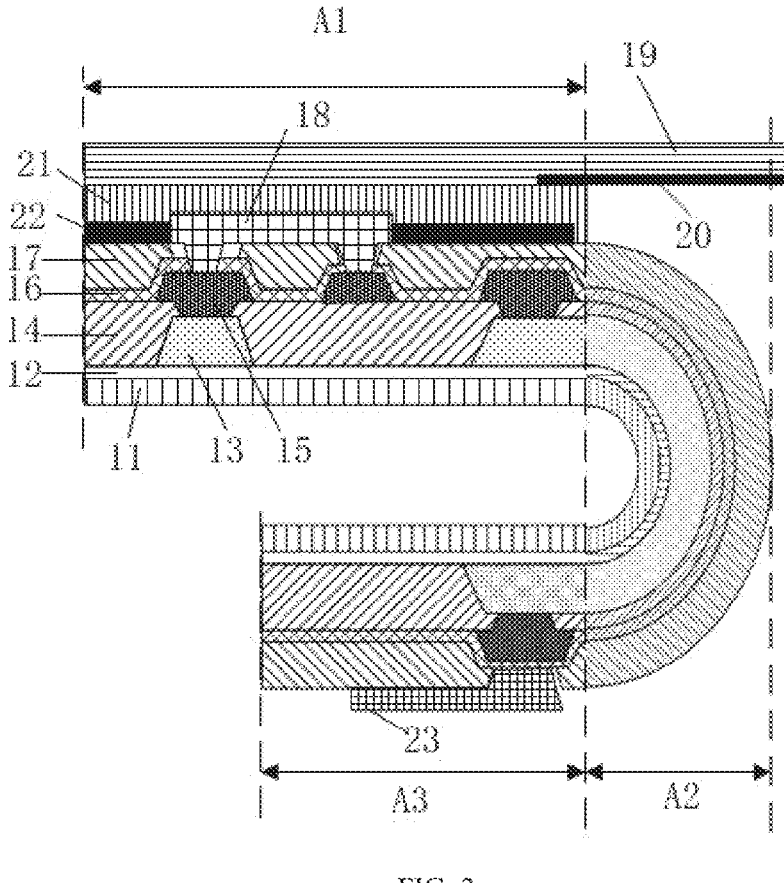
FIG. 3 schematically shows a schematic structural diagram of the displaying base plate in the display panel shown in FIG. 2.

Referring to FIG. 3, a schematic structural diagram of the displaying base plate in the display panel shown in FIG. 2 is shown. Each of the displaying base plates may comprise a flexible substrate 11 and a transparent cover plate 19 that are provided in stack. The flexible substrate 11 is delimited into a displaying region A1, a bending region A2 and a bonding region A3, the displaying region A1 and the bonding region A3 are connected by the bending region A2, the displaying region A1 and the bonding region A3 are parallel, and the bonding region A3 is located on the side of the displaying region A1 that is away from the transparent cover plate 19. The transparent cover plate 19 is provided with a light shielding layer 20 on the side that is closer to the flexible substrate 11, and the orthographic projection of the bending region A2 on the transparent cover plate 19 is within the area of the light shielding layer 20. The transparent cover plates 19 of the two neighboring displaying base plates at least partially directly contact and abut.

As shown in FIG. 2, the transparent cover plate 19 can support the displaying base plate from the top of the displaying base plate, which omits the operation of providing the rigid base 10 in the displaying base plate, so as to prevent wire-breakage imperfect caused by direct abutting between the rigid base 10 and the bending region A2 of the flexible substrate 11, it improves the yield of the displaying base plate.

Furthermore, the transparent cover plates 19 of the two neighboring displaying base plates at least partially contact or abut, and because the flatness of the transparent cover plates 19 are high, it can facilitate the splicing between the displaying base plates. Accordingly, after a plurality of the displaying base plates have been spliced, the side of the transparent cover plates 19 can exhibit a good flatness, to improve the effect of splicing of the displaying base plates.

Moreover, as shown in FIG. 2, when the two neighboring displaying base plates are spliced on one side of the bending regions A2, because the orthographic projection of the bending region A2 on the transparent cover plate 19 is within the area of the light shielding layer 20, the light shielding layer 20 can block the gap between the two neighboring displaying base plates, to prevent chromatic aberration at the gap, which can improve the effect of displaying of the display panel.

In some alternative embodiments of the present application, the material of the transparent cover plate 19 may comprise at least one of a glass and a transparent plastic. The transparent cover plate 19 has a good light transmittance and a high strength. Accordingly, the transparent cover plate 19 can realize reliable supporting to the displaying base plate while realizing the function of light transmission.

As shown in FIG. 3, the cross-sectional shape of the bending region A2 of the displaying base plate may be arcuate. As compared with the displaying base plate shown in FIG. 1, because the displaying base plate according to the present application omits the rigid base 10 at the bottom, it can facilitate to flexibly bend the bending region A2, and the bending radius and the bending position can be flexibly configured according to actual situations.

In an embodiment of the present application, a buffer layer 12, a trace layer 13, a first planarization layer 14, a passivation layer 16 and a second planarization layer 17 are provided in stack on the flexible substrate 11. Each of the displaying region A1 and the bonding region A3 of the flexible substrate 11 further comprises an electrode layer 15, and the electrode layer 15 is located between the first planarization layer 14 and the second planarization layer 17.

Particularly, the material of the flexible substrate 11 may be a flexible material such as polyimide (PI). The thickness of the flexible substrate 11 may be less than 6 μm, to realize a good bendability. The flexible substrate 11 may be used to arrange lines such as coaxial lines. The material of the buffer layer 12 may be silicon nitride, silicon oxide or silicon oxynitride. The thickness of the buffer layer 12 is 50 nm to 300 nm. The buffer layer 12 is used to block water vapor from entering the interior of the displaying base plate. The material of the trace layer 13 may be at least one of copper, molybdenum, titanium and aluminum. The thickness of the trace layer 13 is greater than 0.6 μm to 1.2 μm. The material of the first planarization layer 14 is a resin material. The thickness of the first planarization layer 14 is less than or equal to 3 μm and it is used to realize the planarization of the displaying base plate. The material of the passivation layer 16 may be silicon nitride, silicon oxide or silicon oxynitride. The thickness of the passivation layer 16 may be 50 nm to 300 nm. The material of the second planarization layer 17 may be a resin material. The thickness of the second planarization layer 17 is less than or equal to 3 μm. As shown in FIG. 3, the buffer layer 12, the trace layer 13, the first planarization layer 14, the passivation layer 16 and the second planarization layer 17 may be individually provided at the displaying region A1, the bending region A2 and the bonding region A3 of the flexible substrate 11.

As shown in FIG. 3, the electrode layer 15 may also be provided between the first planarization layer 14 and the second planarization layer 17. The material of the electrode layer 15 is copper. The thickness of the electrode layer 15 is 0.6 μm to 1.2 μm. The electrode layer 15 is provided merely at the displaying region A1 and the bonding region A3.

In an embodiment of the present application, the displaying base plate may further comprise a light emitting device 18 and a circuit board 23. The light emitting device 18 is electrically connected to the electrode layer 15 located at the displaying region A1, and the light emitting device 18 is located on the side of the transparent cover plate 19 that faces the flexible substrate 11. The circuit board 23 is electrically connected to the electrode layer 15 located at the bonding region A3.

In practical applications, when the light emitting device 18 is a miniLED or a microLED, the array formed by the plurality of miniLEDs/microLEDs may be directly used as the displaying pixels of the display panel, and may also be used as a direct-type backlight source.

Particularly, a first opening extending throughout the second planarization layer 17 and the passivation layer 16 is formed at the position of the displaying region A1 that corresponds to the electrode layer 15, and the light emitting device 18 may be electrically connected to the electrode layer 15 by the first opening. A second opening extending throughout the second planarization layer 17 and the passivation layer 16 is formed at the position of the bonding region A3 that corresponds to the electrode layer 15, and the circuit board 23 may be electrically connected to the electrode layer 15 by the second opening.

As shown in FIG. 3, a via hole extending throughout the first planarization layer 14 is formed at the position of the displaying region A1 that corresponds to the trace layer 13, and the electrode layer 15 is electrically connected to the trace layer 13 by the via hole, to realize the signal transmission between the electrode layer 15 and the trace layer 13.

In an embodiment of the present application, the display panel may further comprise a first adhesive layer 21 provided on the side of the light emitting device 18 that faces the transparent cover plate 19, and a second adhesive layer 22 provided between the neighboring light emitting devices 18. Particularly, the second adhesive layer 22 may be a lighttight adhesive such as a black adhesive, to prevent cross-color between the light rays emitted by the light emitting devices 18 and block the internal structure of the displaying base plate. The first adhesive layer 21 may be a light transmitting adhesive such as a white adhesive, to protect the light emitting device 18.

In some alternative embodiments of the present application, the orthographic projection of the second adhesive layer 22 on the transparent cover plate 19 at least partially overlaps with the light shielding layer 20. The second adhesive layer 22 and the light shielding layer 20 can realize sufficient blocking of the internal devices of the displaying base plate, so as to prevent light leakage of the displaying base plate or cross-color of the light rays.

Optionally, the color of the light shielding layer 20 and the color of the second adhesive layer 22 may be the same, so as to eliminate the chromatic aberration after a plurality of displaying base plates have been spliced, which can improve the effect of displaying of the display panel.

For example, when the color of the first adhesive layer 21 is black, the color of the light shielding layer 20 may correspondingly be black.

In an alternative embodiment of the present application, in order to prevent large-visual-angle chromatic aberration caused by metal exposure and light reflection at the bending region A2, the material of the light shielding layer 20 may be a black printing ink, the luminosity of the black printing ink is less than 20, and both of the red-green value and the yellow-blue value of the black printing ink are less than 0.05.

Particularly, the color space Lab is a commonly used standard for measuring the colors standard of products. The color space Lab contains parameters for indicating colors, such as a luminosity (L), a red-green value (a) and a yellow-blue value (b). L represents the brightness of an object, wherein 0-100 represent the black color to the white color. A represents the red color and the green color of an object, wherein a positive value represents the red, and a negative value represents the green. B represents the yellow and the blue of an object, wherein a positive value represents the yellow, and a negative value represents the blue.

In the embodiment of the present application, by selecting the black printing ink whose luminosity is less than 20 and both of red-green value and yellow-blue value are less than 0.05 as the material of the light shielding layer 20, metal exposure and light reflection at the bending region A2 can be prevented, which can prevent a high chromatic aberration at the gap between two neighboring displaying base plates.

In the embodiments of the present application, the transparent cover plate can support the displaying base plate from the top of the displaying base plate, which omits the operation of providing a rigid base in the displaying base plate, so as to prevent wire-breakage imperfect caused by direct abutting between the rigid base and the bending region of the flexible substrate. Furthermore, in the display panel, the transparent cover plates of the two neighboring displaying base plates at least partially contact or abut, and because the flatness of the transparent cover plates are high, it can facilitate the splicing between the neighboring displaying base plates. Moreover, because the orthographic projection of the bending region on the transparent cover plate is within the area of the light shielding layer, the light shielding layer can block the gap between the two neighboring displaying base plates, to prevent chromatic aberration at the gap, which can improve the effect of displaying of the display panel.

Referring to FIG. 4, a flow chart of the steps of the method for fabricating a display panel according to an embodiment of the present application is shown. As shown in FIG. 4, the method may particularly comprise:

Step 401: forming a flexible substrate on a rigid base, wherein the flexible substrate is delimited into a displaying region, a bending region and a bonding region.

In an embodiment of the present application, as shown in FIG. 5, the flexible substrate 11 may be formed on a rigid base 10. Particularly, the material of the rigid base 10 may be a rigid material. The rigid material may particularly be any one of quartz, glass, silicon dioxide, silicon, plastic and polymethyl methacrylate. The thickness of the rigid base 10 is greater than 500 μm, to realize a good rigidity.

Particularly, the material of the flexible substrate 11 may be an organic material such as PI. The thickness of the flexible substrate 11 may be less than 6 μm. The flexible substrate 11 may be formed by using a spread-coating process. As shown in FIG. 5, the flexible substrate 11 may be classified into a displaying region A1, a bending region A2 and a bonding region A3.

Step 402: covering the flexible substrate with the transparent cover plate, wherein the transparent cover plate is provided with a light shielding layer on one side that is closer to the flexible substrate.

In an embodiment of the present application, the transparent cover plate 19 may cover the flexible substrate 11, the transparent cover plate 19 is provided with a light shielding layer 20, and the light shielding layer 20 is closer to the flexible substrate 11, to block the bending region A2 of the flexible substrate 11.

Particularly, the material of the transparent cover plate 19 may be a glass or a transparent plastic. In order to realize sufficient adhesion between the transparent cover plate 19 and the flexible substrate 11, the transparent cover plate 19 may extend beyond the boundary of the displaying region A1 by above 100 μm, and the precision of the adhesion and alignment may be controlled to be within ±20 μm.

In an alternative embodiment of the present application, before covering the flexible substrate 11 with the transparent cover plate 19, the method may also comprise the following steps:

Step S11: forming a buffer layer, a trace layer, a first planarization layer, an electrode layer, a passivation layer and a second planarization layer on the flexible substrate, wherein the electrode layer is located at the displaying region and the bonding region.

Figures 6, 7, 8:
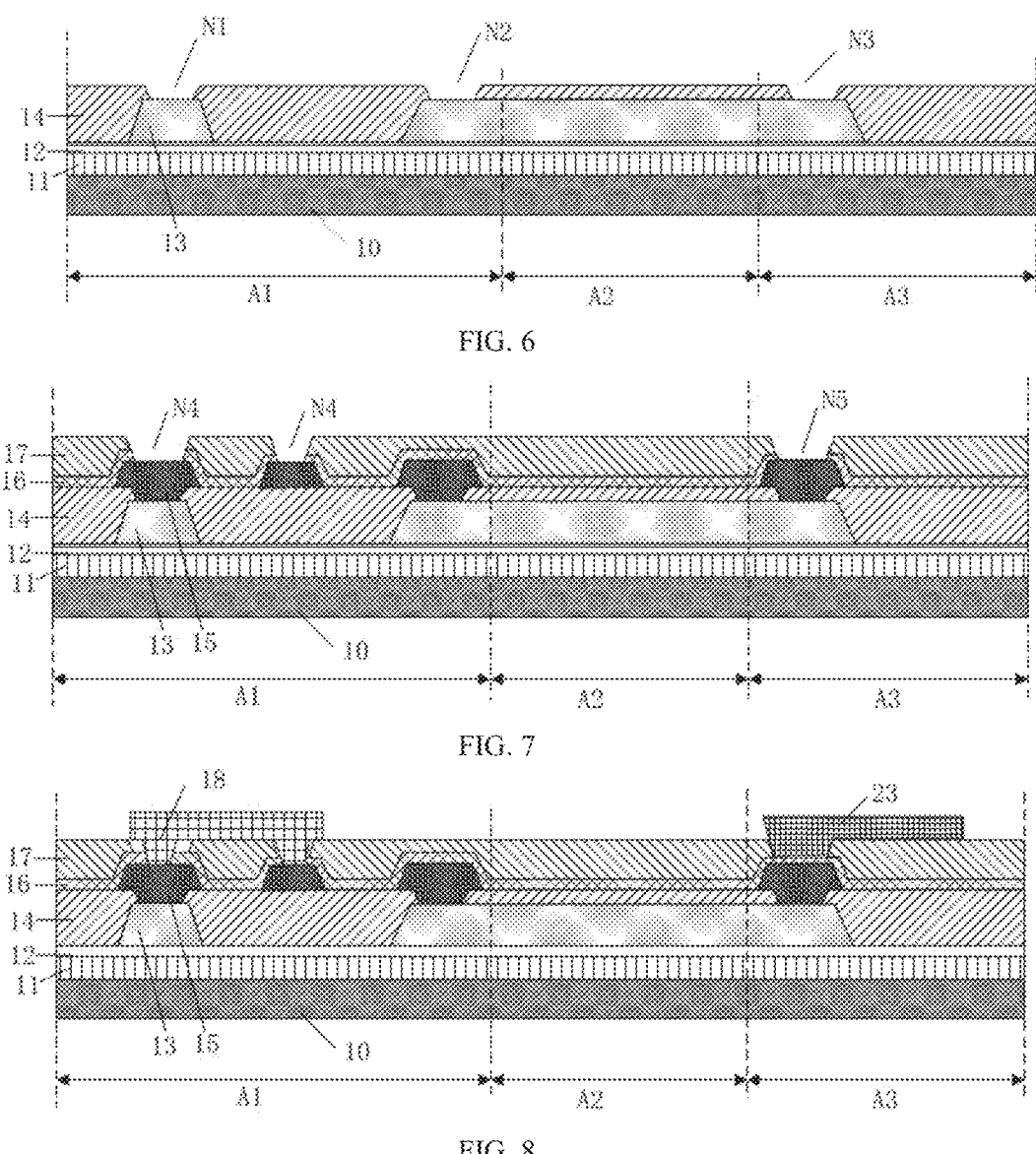
FIG. 6 schematically shows a schematic structural diagram of the formation of the buffer layer, the trace layer and the first planarization layer.
FIG. 7 schematically shows a schematic structural diagram of the formation of the electrode layer, the passivation layer and the second planarization layer.
FIG. 8 schematically shows a schematic structural diagram of the connection to the light emitting device and the circuit board.

In an embodiment of the present application, as shown in FIG. 6, a buffer layer 12, a trace layer 13 and a first planarization layer 14 may be formed sequentially on the flexible substrate 11. Particularly, the buffer layer 12 may be deposited on the flexible substrate 11 by using a depositing process. The material of the buffer layer 12 may be silicon nitride, silicon oxide or silicon oxynitride. The thickness of the buffer layer 12 is 50 nm to 300 nm.

In practical applications, the trace layer 13 may be formed on the buffer layer 12 by using a patterning process. The material of the trace layer 13 may be at least one of copper, molybdenum, titanium and aluminum. The thickness of the trace layer 13 is greater than 0.6 μm to 1.2 μm.

It should be noted that the patterning process according to the embodiments of the present disclosure comprises thinfilm deposition, photoresist spread coating, exposure by using a mask, development, etching, photoresist removal and so on.

Particularly, after the trace layer 13 has been formed, the process may comprise spread-coating a layer of a planarization-layer material covering the trace layer 13, and exposing the planarization-layer material by using a mask, to form, at the displaying region A1, a first via hole N1 and a second via hole N2 that extend throughout the planarization-layer material, and to form, at the bonding region A3, a third via hole N3 extending throughout the planarization-layer material, so as to form the first planarization layer 14 provided with the first via hole N1, the second via hole N2 and the third via hole N3. The material of the first planarization layer 14 is a resin material. The thickness of the first planarization layer 14 is less than or equal to 3 μm.

As shown in FIG. 6, the buffer layer 12, the trace layer 13 and the first planarization layer 14 may be individually provided at the displaying region A1, the bending region A2 and the bonding region A3 of the flexible substrate 11.

As shown in FIG. 7, after the first planarization layer 14 has been formed, an electrode layer 15 may be formed on the first planarization layer 14 by using a patterning process. The electrode layer 15 at the displaying region A1 may be electrically connected to the trace layer 13 by the first via hole N1 and the second via hole N2 extending throughout the first planarization layer 14, and the electrode layer 15 at the bonding region A3 may be electrically connected to the trace layer 13 by the third via hole N3 extending throughout the first planarization layer 14. Particularly, the material of the electrode layer 15 may be at least one of copper, molybdenum, titanium and aluminum. The thickness of the electrode layer 15 is 0.6 μm to 1.2 μm.

Subsequently, a passivation layer 16 may be formed on the first planarization layer 14 by using a depositing process. The material of the passivation layer 16 may be silicon nitride, silicon oxide or silicon oxynitride. The thickness of the passivation layer 16 may be 50 nm to 300 nm. Subsequently, a planarization-layer material may be spread-coated on the passivation layer 16, to obtain a second planarization layer 17. The material of the second planarization layer 17 may be a resin material. The thickness of the second planarization layer 17 is less than or equal to 3 μm.

As shown in FIG. 7, after the second planarization layer 17 has been formed, a first opening N4 extending throughout the second planarization layer 17 and the passivation layer 16 may be formed at the position of the displaying region A1 that corresponds to the electrode layer 15, and a second opening N5 extending throughout the second planarization layer 17 and the passivation layer 16 may be formed at the position of the bonding region A3 that corresponds to the electrode layer 15. In practical applications, the first opening N4 may be used to electrically connect the light emitting device 18, and the second opening N5 may be used to electrically connect the circuit board 23.

Step S12: electrically connecting the light emitting device to the electrode layer located at the displaying region, and electrically connecting the circuit board to the electrode layer located at the bonding region.

In an embodiment of the present application, as shown in FIG. 8, after the passivation layer 16 and the second planarization layer 17 have been formed, the process may comprise electrically connecting the light emitting device 18 to the electrode layer 15 located at the displaying region A1, and the circuit board 23 is electrically connected to the electrode layer 15 located at the bonding region A3. Particularly, the process comprises spread-coating a tin cream on the electrode layer 15 exposed at the first opening N4 extending throughout the second planarization layer 17 and the passivation layer 16, and a tin cream is spread-coated on the electrode layer 15 exposed at the second opening N5 extending throughout the second planarization layer 17 and the passivation layer 16; subsequently, the leads of the light emitting device 18 are contacted with the tin cream on the electrode layer 15 via the first opening N4, and the circuit board 23 is contacted with the tin cream on the electrode layer 15 via the second opening N5; and finally, the spread-coated tin cream is heat, to melt the tin cream. After the tin cream has cooled, the electric connection between the light emitting device 18 and the electrode layer 15 of the displaying region A1 and the electric connection between the circuit board 23 and the electrode layer 15 of the bonding region A3 can be realized.

Step S13: forming a first adhesive layer on one side of the light emitting device that faces the transparent cover plate, and forming a second adhesive layer between neighboring light emitting devices.

Figures 9, 10, 11:
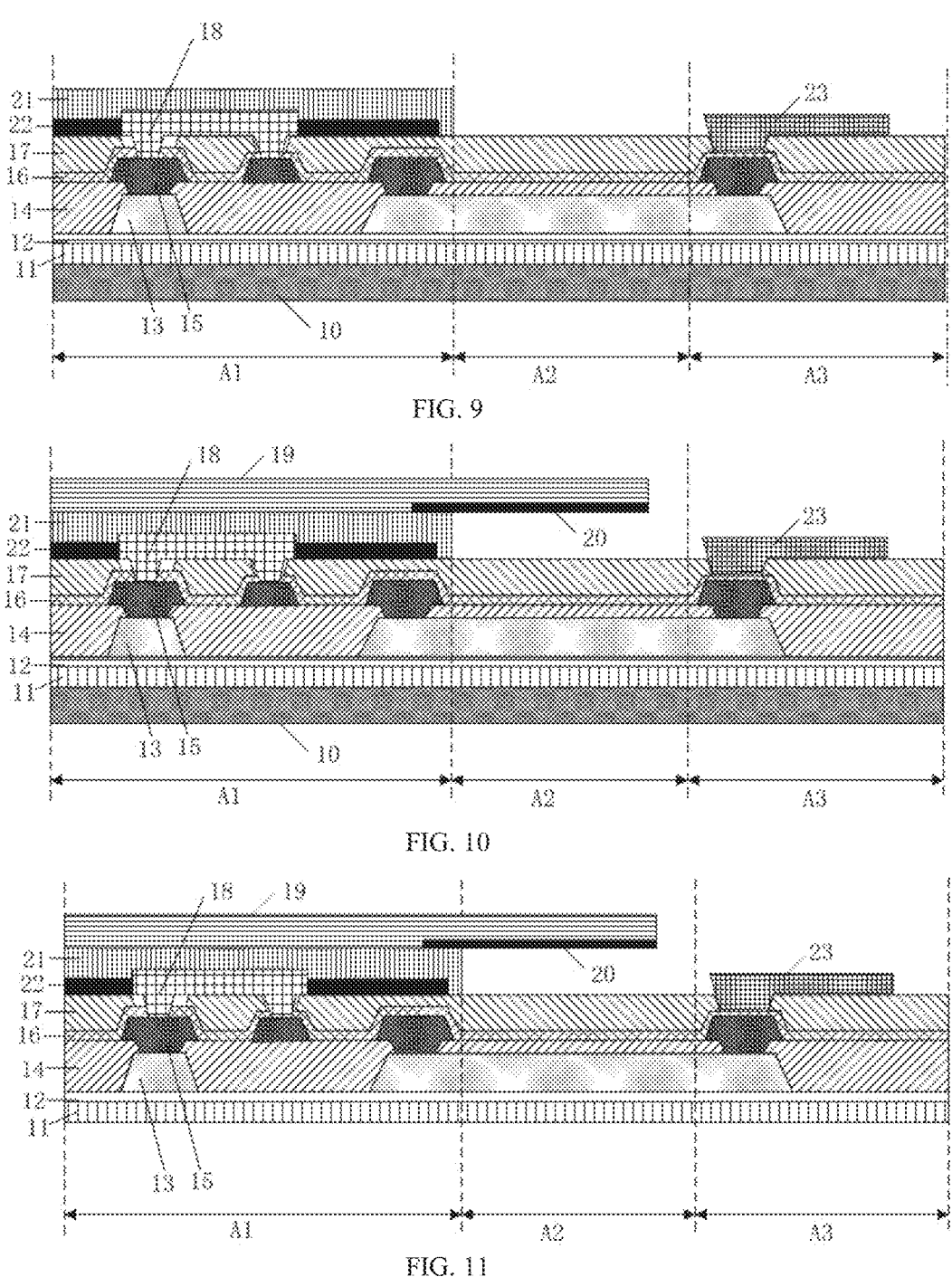
FIG. 9 schematically shows a schematic structural diagram of the formation of the first adhesive layer and the second adhesive layer.
FIG. 10 schematically shows a schematic structural diagram of the covering by the transparent cover plate.
FIG. 11 schematically shows a schematic structural diagram when the rigid base has been removed.

In an embodiment of the present application, as shown in FIG. 9, after the light emitting device 18 and the circuit board 23 have been bonded, the process may comprise forming a first adhesive layer 21 on the side of the light emitting device 18 that faces the transparent cover plate 19, and a second adhesive layer 22 between the neighboring light emitting devices 18 is formed. Particularly, the first adhesive layer 21 may be a light transmitting adhesive such as a white adhesive, and the second adhesive layer 22 may be a lighttight adhesive such as a black adhesive.

As shown in FIG. 10, after the first adhesive layer 21 and the second adhesive layer 22 have been formed, the transparent cover plate 19 may be adhered to the first adhesive layer 21. Particularly, the transparent cover plate 19 may cover at least the displaying region A1 and part of the bending region A2.

Step 403: removing the rigid base.

In an embodiment of the present application, as shown in FIG. 11, after the flexible substrate 11 has been covered by the transparent cover plate 19, the rigid base 10 at the bottom of the flexible substrate 11 may be removed.

In an alternative embodiment of the present application, the rigid base 10 may be removed by laser lift-off. In the process of the lift-off of the rigid base 10 by using the laser technique, in order to prevent the affection on the formation of the flexible substrate 11 or the light emitting device 18 by full laser cutting (in other words, the cutting thickness is the thickness of the rigid base 10), in practical applications, the laser should not fully cut the rigid base 10 throughout the thickness. For example, when the thickness of the rigid base 10 is 500 nm, the depth of the laser cutting may be controlled to be 200 μm. Subsequently, the removal of the remaining part is done by mechanical cleavage.

Step 404: bending the bending region of the flexible substrate, to obtain a displaying base plate, wherein an orthographic projection of the bending region on the transparent cover plate is within an area of the light shielding layer.

Figure 12:
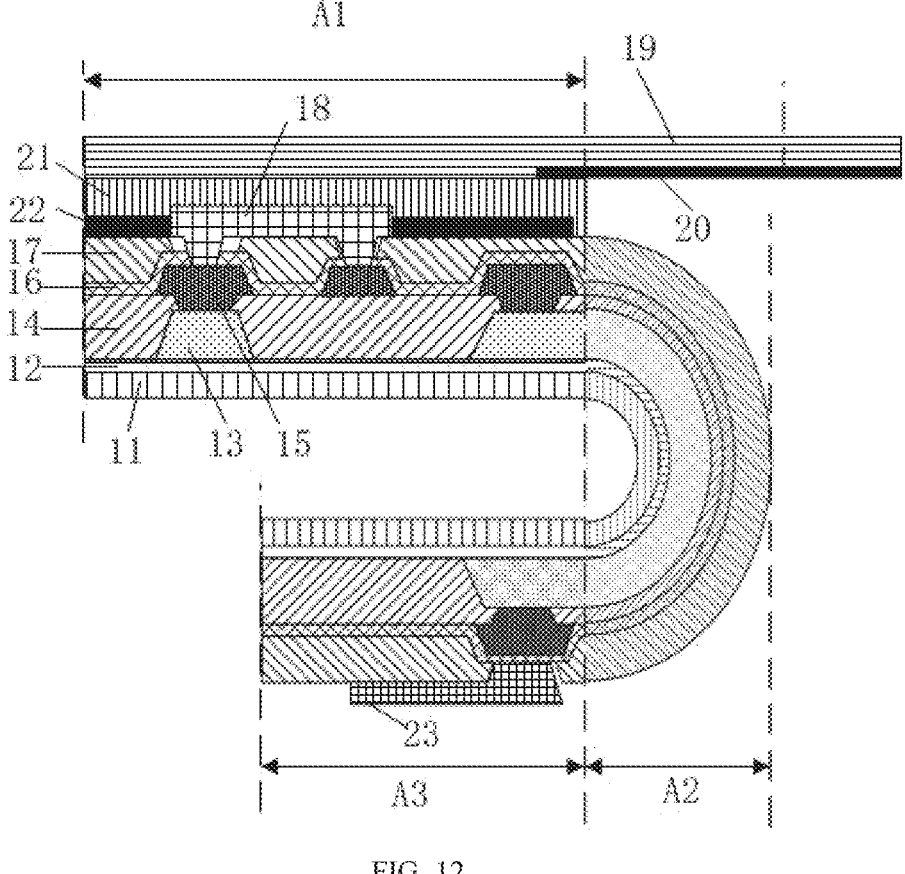
FIG. 12 schematically shows a schematic structural diagram after the bending region of the displaying base plate has been bent.

In an embodiment of the present application, as shown in FIG. 12, after the rigid base 10 has been removed, the bending region A2 of the flexible substrate 11 may be bent toward the side that is away from the transparent cover plate 19, so that the displaying region A1 and the bonding region A3 are parallel.

As shown in FIG. 12, after the bending region of the flexible substrate 11 has been bent, the edge of the transparent cover plate 19 tends to extend beyond the edge of the bending region A2. In order to reduce the area of the displaying base plate, to arrange as many displaying base plates as possible in the display panel, it is required to remove the part of the transparent cover plate 19 that extends beyond the bending region A2 by laser cutting.

As an example, the process may comprise, after bending the bending region A2 of the flexible substrate 11, providing a foam piece between the displaying region A1 and the bonding region A3, and fixing the displaying region A1 and the bonding region A3 to the foam piece by using an adhesive tape, to maintain the displaying base plate in a bending state; subsequently, by referring to the orthographic projection of the bending region A2 on the transparent cover plate 19, making a cutting-position marker on the transparent cover plate 19; and finally, cutting the transparent cover plate 19 at the marker by laser cutting, to obtain the displaying base plate shown in FIG. 3.

It should be noted that, in particular applications, the cutting width of the transparent cover plate 19 may be provided by referring to the pixel spacing of the displaying base plate. For example, if the pixel spacing of the displaying base plate is 1.25 mm, then the width that remains after the cutting of the transparent cover plate 19 should be less than a half of the pixel spacing, to ensure the effect of displaying after a plurality of displaying base plates have been spliced.

Step 405: providing the transparent cover plates of at least two instances of the displaying base plate on a same side, wherein the transparent cover plates of two neighboring instances of the displaying base plates directly contact and abut, to obtain the display panel.

In an embodiment of the present application, when it is required to splice at least two displaying base plates, the process may comprise arranging the transparent cover plates 19 of the at least two displaying base plates on the same side, and, subsequently, directly contacting and abutting the transparent cover plates 19 of the two neighboring displaying base plates, to obtain the display panel shown in FIG. 2.

Particularly, in the display panel, it is merely required that the transparent cover plates 19 of the two neighboring displaying base plates are directly contacted, and no further fixed connection is required, to facilitate the regulation on the relative position between the displaying base plates.

In the embodiments of the present application, the transparent cover plate can support the displaying base plate from the top of the displaying base plate, which omits the operation of providing a rigid base in the displaying base plate, so as to prevent wire-breakage imperfect caused by direct abutting between the rigid base and the bending region of the flexible substrate. Furthermore, in the display panel, the transparent cover plates of the two neighboring displaying base plates at least partially contact or abut, and because the flatness of the transparent cover plates are high, it can facilitate the splicing between the neighboring displaying base plates. Moreover, because the orthographic projection of the bending region on the transparent cover plate is within the area of the light shielding layer, the light shielding layer can block the gap between the two neighboring displaying base plates, to prevent chromatic aberration at the gap, which can improve the effect of displaying of the display panel.

An embodiment of the present application further provides a displaying device, wherein the displaying device may particularly comprise the displaying base plate stated above.

In the embodiment of the present application, the structure of the display panel may be the same as the structure of the display panel according to the above embodiments, and is not discussed herein further.

In the embodiments of the present application, the transparent cover plate in the display panel can support the displaying base plate from the top of the displaying base plate, which omits the operation of providing a rigid base in the displaying base plate, so as to prevent wire-breakage imperfect caused by direct abutting between the rigid base and the bending region of the flexible substrate. Furthermore, in the display panel, the transparent cover plates of the two neighboring displaying base plates at least partially contact or abut, and because the flatness of the transparent cover plates are high, it can facilitate the splicing between the neighboring displaying base plates. Moreover, because the orthographic projection of the bending region on the transparent cover plate is within the area of the light shielding layer, the light shielding layer can block the gap between the two neighboring displaying base plates, to prevent chromatic aberration at the gap, which can improve the effect of displaying of the displaying device.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Some or all of the modules may be selected according to the actual demands to realize the purposes of the solutions of the embodiments. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

The description provided herein describes many concrete details. However, it can be understood that the embodiments of the present application may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present application may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present application, and not to limit them. Although the present application is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

The invention claimed is:

1. A display panel, wherein the display panel comprises at least two neighboring displaying base plates;

each of the displaying base plates comprises a flexible substrate and a transparent cover plate that are provided in stack;

the flexible substrate is delimited into a displaying region, a bending region and a bonding region, the displaying region and the bonding region are connected by the bending region, the displaying region and the bonding region are parallel, and the bonding region is located on one side of the displaying region that is away from the transparent cover plate;

the transparent cover plate is provided with a light shielding layer on one side that is closer to the flexible substrate, an orthographic projection of the bending region on the transparent cover plate is within an area of the light shielding layer, and the orthographic projection of the bending region on the transparent cover plate does not overlap with the displaying region; and the transparent cover plates of the two neighboring displaying base plates at least partially directly contact and abut.

2. The display panel according to claim 1, wherein a buffer layer, a trace layer, a first planarization layer, a passivation layer and a second planarization layer are provided in stack on the flexible substrate; and each of the displaying region and the bonding region of the flexible substrate further comprises an electrode layer, and the electrode layer is located between the first planarization layer and the second planarization layer.

3. The display panel according to claim 2, wherein the displaying base plate further comprises a light emitting device and a circuit board;

the light emitting device is electrically connected to the electrode layer located at the displaying region, and the light emitting device is located on the one side of the transparent cover plate that is closer to the flexible substrate; and the circuit board is electrically connected to the electrode layer located at the bonding region.

4. The display panel according to claim 3, wherein the display panel further comprises a first adhesive layer provided on one side of the light emitting device that faces the transparent cover plate, and, a second adhesive layer provided between the neighboring light emitting devices.

5. The display panel according to claim 4, wherein an orthographic projection of the second adhesive layer on the transparent cover plate at least partially overlaps with the light shielding layer.

6. The display panel according to claim 5, wherein a color of the light shielding layer and a color of the second adhesive layer are the same.

7. The display panel according to claim 1, wherein a material of the light shielding layer is a black printing ink, a luminosity of the black printing ink is less than 20, and both of a red-green value and a yellow-blue value of the black printing ink are less than 0.05.

8. The display panel according to claim 1, wherein a material of the transparent cover plate comprises at least one of a glass and a transparent plastic.

9. A displaying device, wherein the displaying device comprises the display panel according to claim 1.

10. The displaying device according to claim 9, wherein a buffer layer, a trace layer, a first planarization layer, a passivation layer and a second planarization layer are provided in stack on the flexible substrate; and each of the displaying region and the bonding region of the flexible substrate further comprises an electrode layer, and the electrode layer is located between the first planarization layer and the second planarization layer.

11. The displaying device according to claim 10, wherein the displaying base plate further comprises a light emitting device and a circuit board;

the light emitting device is electrically connected to the electrode layer located at the displaying region, and the light emitting device is located on the one side of the transparent cover plate that is closer to the flexible substrate; and the circuit board is electrically connected to the electrode layer located at the bonding region.

12. The displaying device according to claim 11, wherein the display panel further comprises a first adhesive layer provided on one side of the light emitting device that faces the transparent cover plate, and, a second adhesive layer provided between the neighboring light emitting devices.

13. The displaying device according to claim 12, wherein an orthographic projection of the second adhesive layer on the transparent cover plate at least partially overlaps with the light shielding layer.

14. The displaying device according to claim 13, wherein a color of the light shielding layer and a color of the second adhesive layer are the same.

15. The displaying device according to claim 9, wherein a material of the light shielding layer is a black printing ink, a luminosity of the black printing ink is less than 20, and both of a red-green value and a yellow-blue value of the black printing ink are less than 0.05.

16. The displaying device according to claim 9, wherein a material of the transparent cover plate comprises at least one of a glass and a transparent plastic.

* * * * *